(12) United States Patent
Agarwal et al.

(10) Patent No.: US 9,601,424 B2
(45) Date of Patent: Mar. 21, 2017

(54) INTERPOSER AND METHODS OF FORMING AND TESTING AN INTERPOSER

(71) Applicant: GLOBALFOUNDRIES, INC., Grand Cayman (KY)

(72) Inventors: Rahul Agarwal, Waterford, NY (US); Jens Oswald, Dresden (DE); Sheng Feng Lu, Baoshan Township (TW); Soon Leng Tan, Singapore (SG); Jeffrey Lam, Singapore (SG)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/684,664

(22) Filed: Apr. 13, 2015

(65) Prior Publication Data

US 2016/0300788 A1   Oct. 13, 2016

(51) Int. Cl.
 *H01L 21/48* (2006.01)
 *H01L 21/66* (2006.01)
 *H01L 23/498* (2006.01)
 *G01R 31/04* (2006.01)

(52) U.S. Cl.
 CPC ........ *H01L 23/49827* (2013.01); *G01R 31/04* (2013.01); *H01L 21/486* (2013.01); *H01L 21/4853* (2013.01); *H01L 22/14* (2013.01); *H01L 23/49816* (2013.01); *H01L 2221/68372* (2013.01)

(58) Field of Classification Search
 CPC ......... H01L 23/49811; H01L 23/49816; H01L 23/49827; H01L 2221/68372; H01L 21/486; H01L 2224/0401; H01L 2224/73204; H01L 24/05; H01L 22/34; H01L 2924/00; H01L 2924/0002; H01L 21/76898; H01L 23/481; G01R 31/04
 See application file for complete search history.

(56) References Cited

U.S. PATENT DOCUMENTS

| 2010/0072579 A1* | 3/2010 | Thies | ................ H01L 21/76898 257/621 |
| 2012/0228746 A1* | 9/2012 | Nagata | ............. H01L 27/14618 257/621 |

* cited by examiner

*Primary Examiner* — Jasmine Clark
(74) *Attorney, Agent, or Firm* — Lorenz & Kopf, LLP

(57) ABSTRACT

A method of forming and testing an interposer includes forming vias in a semiconductor material of a wafer having a front side and a back side. The method further includes disposing an electrically conductive layer on the front side of the wafer such that the layer is electrically connected to the vias. The method also includes forming electrically conductive pads on the front side of the wafer, wherein each electrically conductive pad is electrically connected to the electrically conductive layer. The method further includes forming electrically conductive bumps on the back side of the wafer, wherein each electrically conductive bump is electrically connected to at least one via. The method also includes testing electrical connectivity from a first bump to a second bump of the electrically conductive bumps.

14 Claims, 9 Drawing Sheets

# INTERPOSER AND METHODS OF FORMING AND TESTING AN INTERPOSER

TECHNICAL FIELD

The technical field relates to an interposer for an integrated circuit. More specifically, the technical field relates to methods of forming and testing the interposer.

BACKGROUND

With three-dimensional ("3D") and 2.5 D integrated circuits, an interposer is typically utilized to interconnect various devices. These interposers are often the least expensive silicon-based component of such integrated circuits. As such, interposers are typically tested for proper functionality prior to bonding to the other devices.

Therefore, it is desirable to present methods for testing interposers prior to bonding to other devices. It is also desirable to present methods for testing interposers during a routine production process of the interposers. In addition, other desirable features and characteristics will become apparent from the subsequent summary and detailed description, and the appended claims, taken in conjunction with the accompanying drawings and this background.

BRIEF SUMMARY

In one embodiment, a method of forming and testing an interposer includes forming vias in a semiconductor material of a wafer having a front side and a back side. An electrically conductive layer is disposed on the front side of the wafer such that the layer is electrically connected to the vias. The method further includes forming electrically conductive pads on the front side of the wafer, wherein each electrically conductive pad is electrically connected to the electrically conductive layer. The method further includes forming electrically conductive bumps on the back side of the wafer, wherein each electrically conductive bump is electrically connected to at least one of the vias. The method also includes testing electrical connectivity from a first bump of the electrically conductive bumps to a second bump of the electrically conductive bumps after said disposing of the electrically conductive layer.

An interposer for an integrated circuit according to one embodiment includes a wafer. The wafer comprises a semiconductor material and defines a front side and a back side. Vias are disposed within the semiconductor material. An electrically conductive layer is disposed on the front side of the wafer and electrically connected to the vias. The interposer also includes electrically conductive pads disposed on the front side of the wafer and electrically connected to the electrically conductive layer. Electrically conductive bumps are disposed on the back side of the wafer wherein each electrically conductive bump is electrically connected to at least one of the vias.

BRIEF DESCRIPTION OF THE DRAWINGS

Other advantages of the disclosed subject matter will be readily appreciated, as the same becomes better understood by reference to the following detailed description when considered in connection with the accompanying drawings wherein.

DETAILED DESCRIPTION

Referring to the Figures, wherein like numerals indicate like parts throughout the several views, an interposer 100 and methods 200 of forming and testing the interposer 100 are shown and described herein.

The interposer 100 described herein may be utilized in an integrated circuit (not shown) as an electrical interface connecting to at least one other semiconductor device (not shown). For instance, the interposer 100 may be utilized in a so-called 2.5-dimension (2.5D) integrated circuit. The interposer 100 may often be referred to by those skilled in the art as a "silicon interposer"—however, it is not absolutely necessary for the interposer 100 to utilize silicon as its base material.

Figure 1:
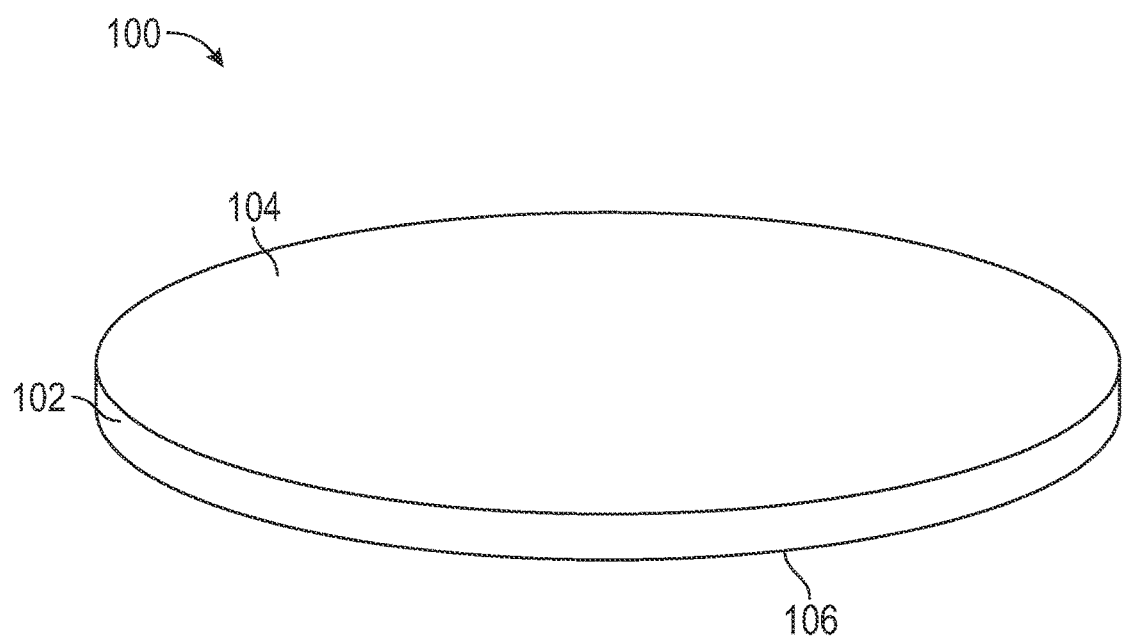
FIG. 1 is a perspective view of a wafer for forming an interposer according to one embodiment.

Referring to FIG. 1, the interposer 100 is produced on a wafer 102 having a front side 104 and a back side 106. The wafer 102 may alternately be referred to as a "substrate" by those skilled in the art. The wafer 102 of the illustrated embodiment comprises a semiconductor material. More particularly, in the illustrated embodiment, the semiconductor material is silicon. However, the wafer 102 may include other materials in addition to or instead of silicon.

Figure 2:
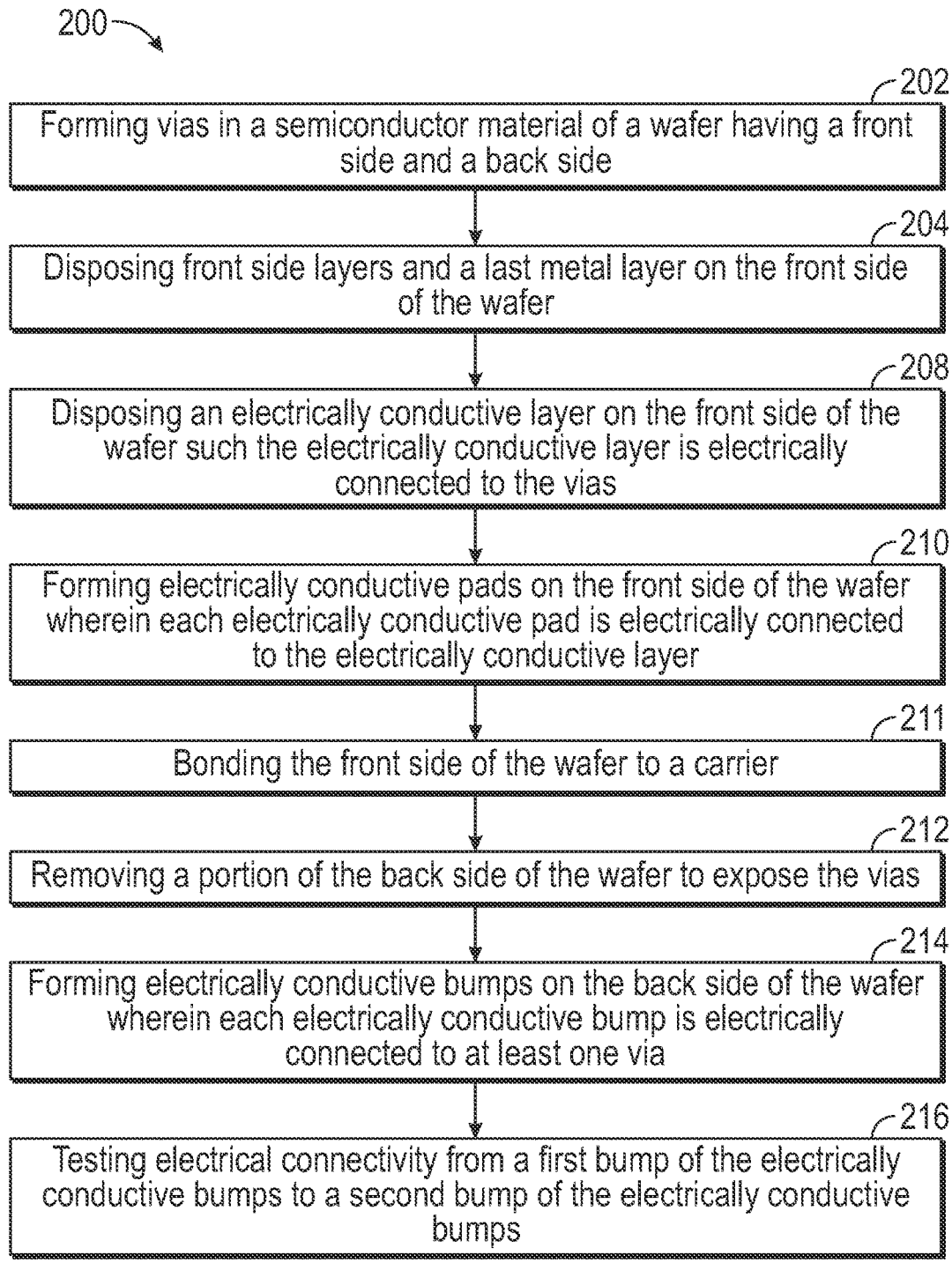
FIG. 2 is a flowchart showing a method of forming and testing the interposer according to one embodiment.
Figure 3:
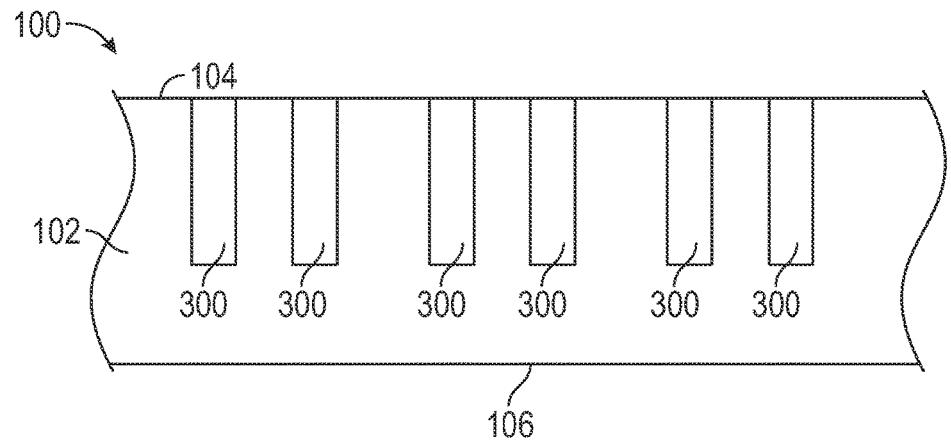
FIG. 3 is a partial cross-sectional side view of the wafer according to one embodiment after forming a plurality of vias.

Referring now to FIGS. 2 and 3, the method 200 of forming and testing the interposer 100 includes, at 202, forming vias 300 in the wafer 102 between the front side 104 and the back side 106. The vias 300 are electrically conductive pillars typically figured to electrically connect elements in a "vertical" fashion. The vias 300 may be referred to by those skilled in the art as through-silicon vias ("TSVs"). Typically, as shown in FIG. 3, the vias 300 are etched from the front side 104 of the wafer 102 toward the back side 106, without initially reaching the back side 106, through processes known to those skilled in the art.

Figure 4:
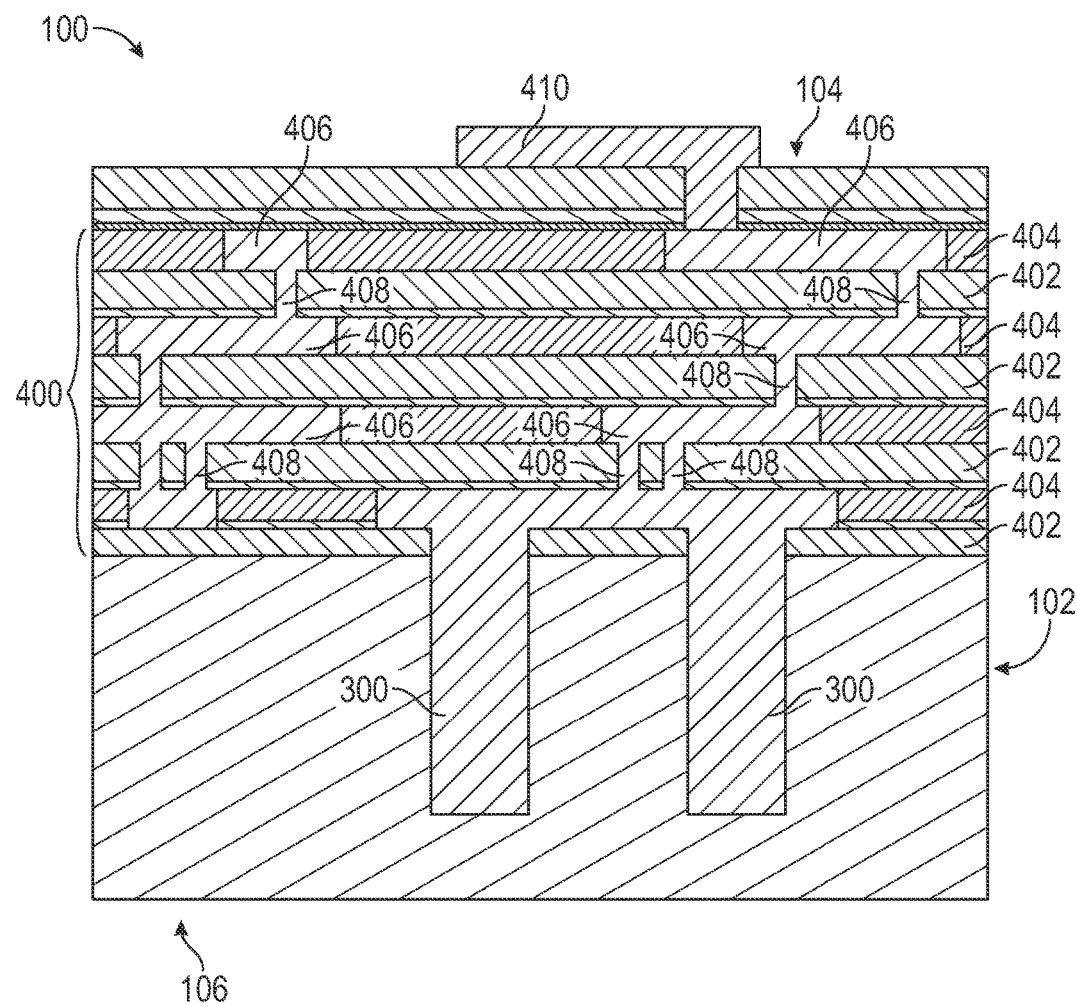
FIG. 4 is a partial cross-sectional side view of the wafer according to one embodiment after disposing a plurality of front side layers and a final metal layer on the wafer.

The method 200 may further include, at 204, disposing a plurality of front side layers 400 and a final metal layer 410 on the front side 104 of the wafer 102. In the illustrated embodiment, as shown in FIG. 4, the front side layers 400 comprise tetraethyl orthosilicate ("TEOS") layers 402 and fluorinated tetraethyl orthosilicate ("FTEOS") 404, disposed in an alternating fashion. However, other materials may also or alternatively be used to form the front side layers 400. Metal layers 406 and additional vias 408 extend through the front side layers 400 and are selectively electrically connected to one another and the vias 300 disposed through the wafer 102. The final metal layer 410 is electrically connected to at least one of the metal layers 406 and/or vias 408 of the front side layers 400. However, it should be appreciated that other configurations of the front side layers 400, metal layers 406, additional vias 408, and final metal layer 410 may be implemented, including embodiments that do not utilize one or more of this layers 400, 406, 410 or vias 408.

Figure 5:
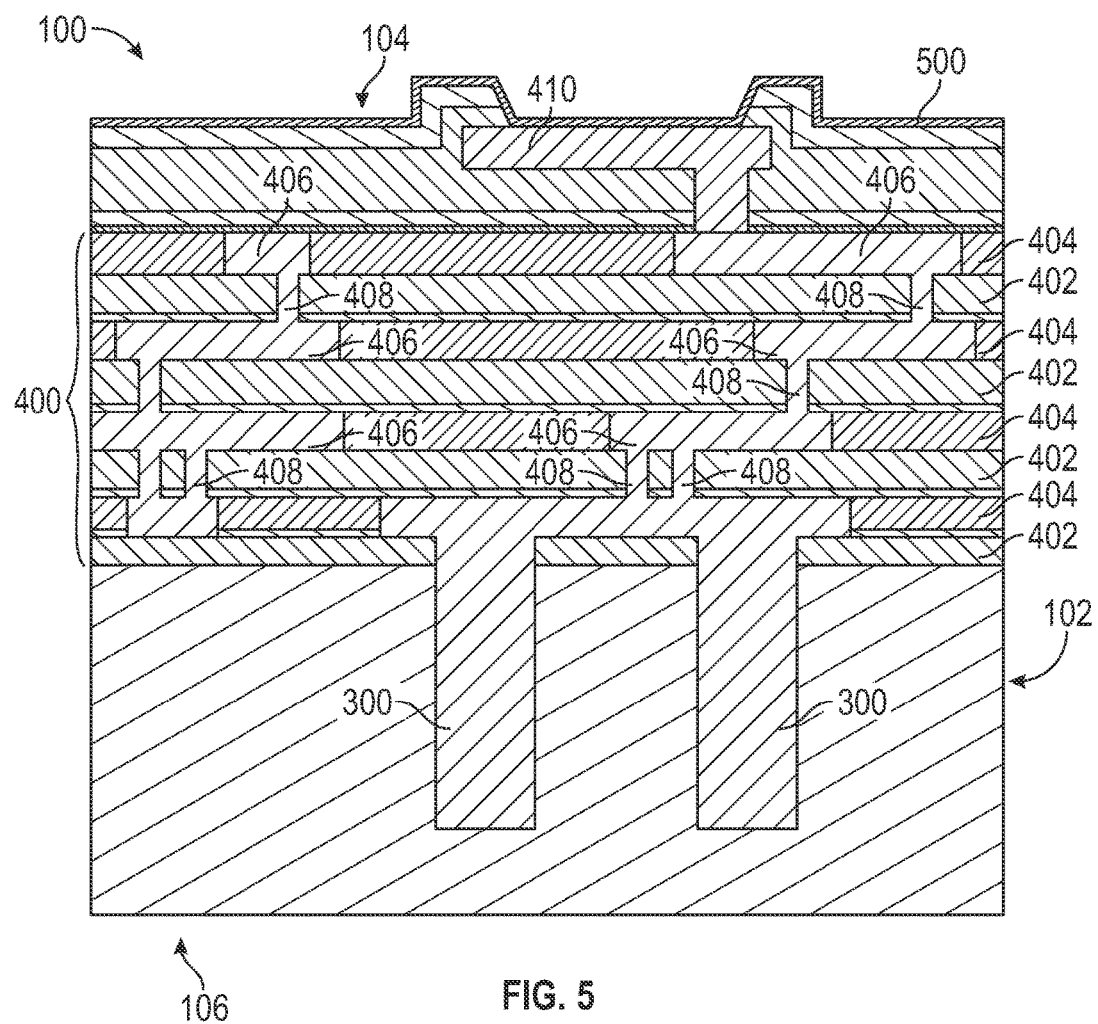
FIG. 5 is a partial cross-sectional side view of the wafer according to one embodiment after forming an electrically conductive layer on the front side of the wafer.
Figure 6:
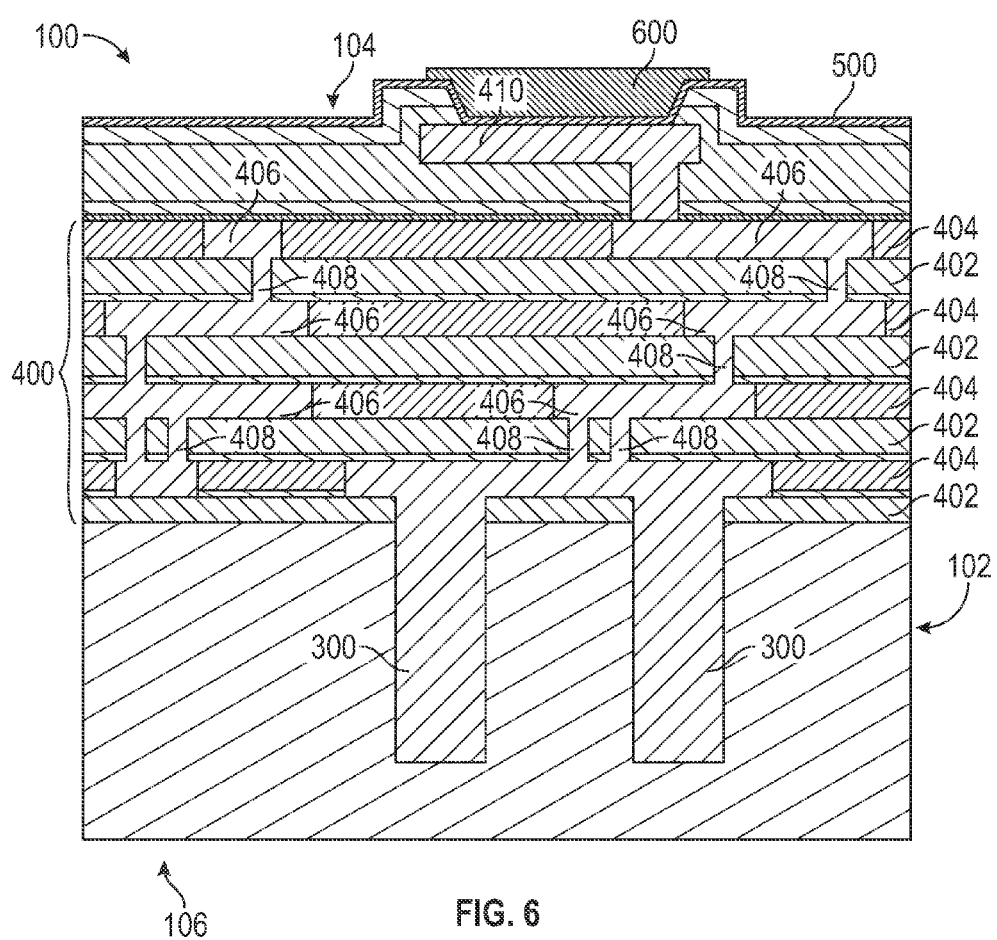
FIG. 6 is a partial cross-sectional side view of the wafer according to one embodiment after disposing an electrically conductive pad on the front side of the wafer.

The method 200 also includes, at 208, disposing an electrically conductive layer 500 on the front side 104 of the wafer 102, as shown in FIG. 5. In the illustrated embodiment, the electrically conductive layer 500 is referred to as an under bump metallization ("UBM") layer (not separately numbered). In the illustrated embodiment, this electrically conductive layer comprises 300 nm of copper ("Cu") and 100 nm of titanium ("Ti"). The Ti acts as a diffusion barrier while the Cu acts as a seed-layer for electro-plating. Thus, the electrically conductive layer 500 may further be referred to as the "seed layer" (not separately numbered). As shown in FIG. 6, the electrically conductive layer 500 is electrically connected to the final metal layer 410, and thus the metal layers 406, additional vias 408, and vias 300. However, in other embodiments, the electrically conductive layer 500 may be directly connected to at least one of the vias 300.

The method 200 further includes, at 210, forming electrically conductive pads 600 on the front side 104 of the wafer 102. Referring now to FIG. 6, each electrically conductive pad 600 is electrically connected to at least one of the vias 300. In the illustrated embodiment, the electrically conductive pad 600 is electrically connected to the conductive layer 500, and thus the final metal layer 410, the metal layers 406, additional vias 408, and vias 300. While FIG. 6 illustrates the electrically conductive layer 500 in electrically connection with one electrically conductive pad 600, it is understood that the electrically conductive layer 500, at this stage, electrically connects a plurality of the electrically conductive pads 600 to one another.

Figure 7:
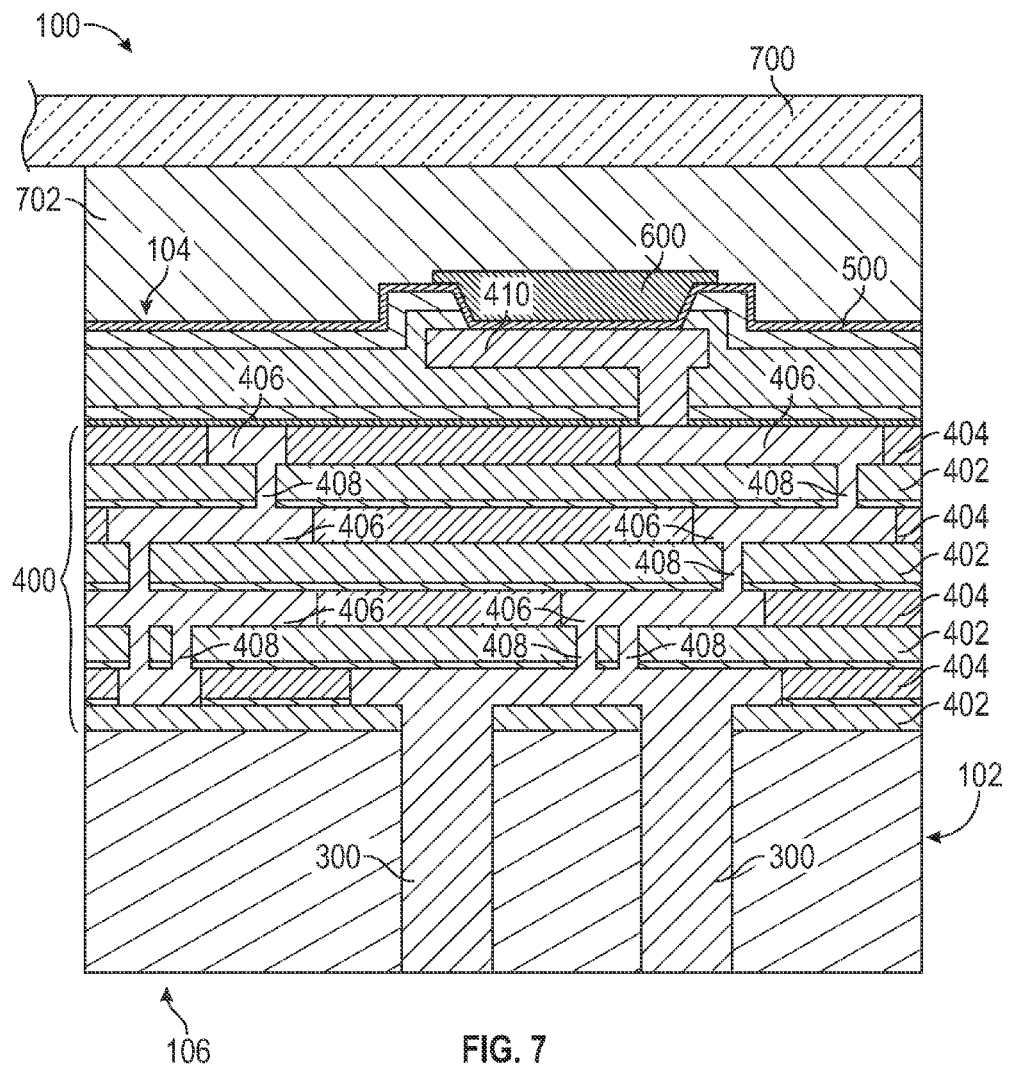
FIG. 7 is a partial cross-sectional side view of the wafer according to one embodiment with the front side bonded to a carrier and after removing a portion of a back side of the wafer to expose the vias.

The method 200 may also include, at 211, bonding the front side 104 of the wafer 102 to a carrier 700, e.g., a glass carrier, as shown in FIG. 7. As should be appreciated, the wafer 102 may be very fragile. Thus, bonding the wafer 102 to the carrier 1012 improves stability of the wafer 102 during testing, as described below. An adhesive layer 702 may be utilized when bonding the wafer 102 to the carrier.

The adhesive layer 702 may be implemented by utilizing the Wafer Support System ("WSS") process provided by, for example, The 3M Company, headquartered in Maplewood, Minn. As such, the adhesive layer 702 may be referred to by those skilled in the art as a WSS bond or a WSS layer. However, other techniques for implementing the adhesive layer 702 may alternately be applied.

The method 200 may also include, at 212, removing a portion of the back side 106 of the wafer 102 to expose the vias 300, as is also shown in FIG. 7. As such, the electrically conductive materials of the vias 300 are available through the back side 106. In the illustrated embodiment, removing the portion of the back side 106 of the wafer 102 is performed after the deposition of the electrically conductive layer 500, the forming of the electrically conductive pads 600, and the bonding to the carrier 700. However, it should be appreciated that the specific ordering of the various steps of the method 200 may be different in other embodiments.

Figure 8:
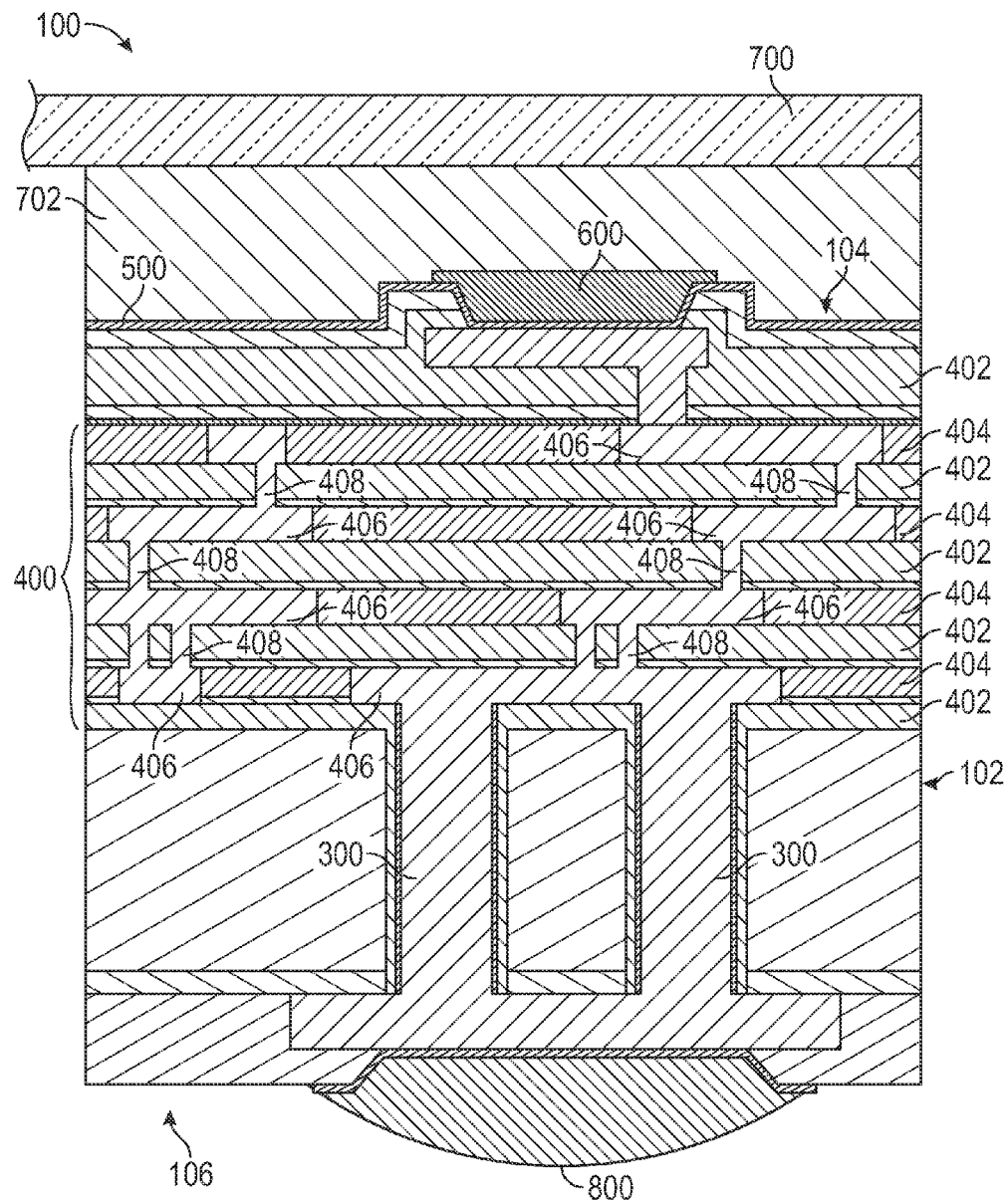
FIG. 8 is a partial cross-sectional side view of the wafer according to one embodiment after forming a plurality of electrically conductive bumps on the back side of the wafer.

The method 200 further includes, at 214, forming a plurality of electrically conductive bumps 800 on the back side 106 of the wafer 102, as is shown in FIG. 8. Each electrically conductive bump 800 is electrically connected to at least one of the vias 300.

Figure 9:
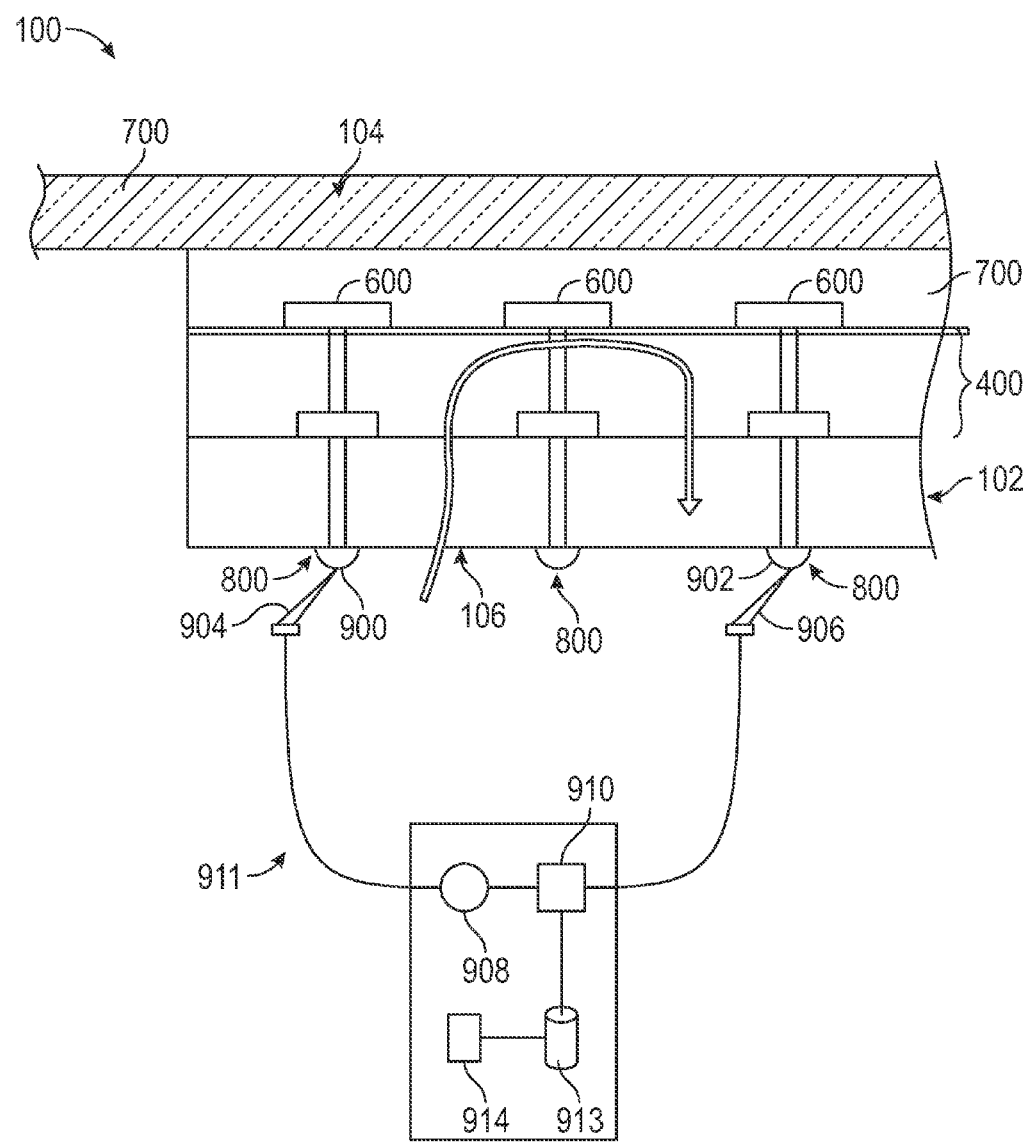
FIG. 9 is a partial cross-sectional side view of the wafer according to one embodiment showing testing electrically connectivity from a first bump to a second bump.

The method 200 also includes, at 216, testing electrical connectivity from a first bump 900 of the electrically conductive bumps 800 to a second bump 902 of the electrically conductive bumps 800, as shown in FIG. 9. This testing of electrically connectivity is performed after the disposing of the electrically conductive layer 500. As the electrically conductive layer 500 electrically connects the electrically conductive pads 600 to one another, a conductive path for a circuit is formed through the first bump 902, one of the vias 300, one of the electrically conductive pads 600, the electrically conductive layer 500, another of the electrically conductive pads 600, another of the vias 300, and the second bump 1002. Of course, the conductive path may further include one or more of the additional vias 408, metal layers 406, and final metal layer 410, according to the particular design of the interposer 100.

By testing electrically connectivity at this stage in the manufacturing process, the interposer 102 can be checked for open circuits and other abnormalities prior to bonding with other devices of the integrated circuit. As such, some or all of the wafer 100 may be rejected, i.e., not used, in a bonding process prior to coupling with more expensive circuits.

In one embodiment, as shown in FIG. 9, the testing of electrically connectivity includes electrically connecting a first probe 904 to the first bump 900 and electrically connecting a second probe 906 to the second bump 902. Once connected, the testing further includes applying an electric current to the first probe 904. The electric current may be generated by a current supply 908 electrically connected to the first probe 904. The electric current will then flow through the conductive path described above, forming an electrical circuit. The testing may also include sensing the electric current received by the second probe 906. A current sensor 910 may be electrically connected to the second probe 906 to sense the electric current.

It should be appreciated that more than two probes 904, 906 may be utilized in the testing of the electrical connectivity. It should also be appreciated that a testing system 911 comprising the probes 904, 906, the current supply 908, and the current sensor 910 may be utilized to test different conductivity paths via different bumps 800. The process of testing various paths of conductivity may be automated such that the system 911 moves the probes through successive bumps 800 in an ordered fashion.

Figure 10:
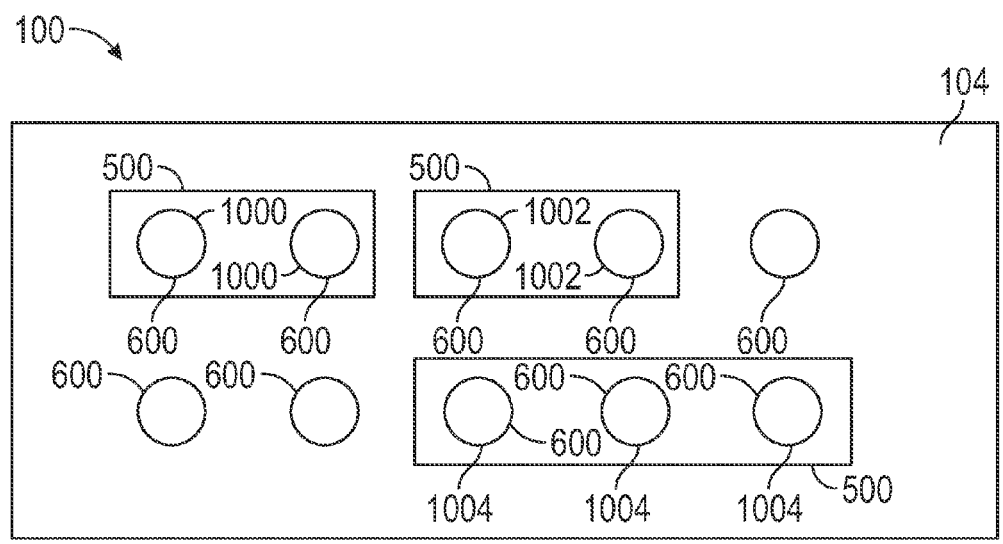
FIG. 10 is a partial top view of the wafer according to one embodiment showing three distinct groups of electrically conductive pads.

In one particular embodiment, the method 200 of forming and testing the interposer 102 may include selectively etching the electrically conductive layer 500. As a result of this selective etching, some of the electrically conductive pads 600 are electrically connected together and electrically isolated from other electrically conductive pads 600. In the illustrated embodiment, as shown in FIG. 10, a first plurality 1000 of electrically conductive pads 600 are electrically connected together, a second plurality 1002 of electrically conductive pads 600 are electrically connected together, and a third plurality 1004 of electrically conductive pads 600 are electrically connected together. Each plurality 1000, 1002, 1004 of electrically conductive pads 600 is electrically isolated from one another.

In the one particular embodiment, described above, the testing of electrical connectivity from one of the electrically conductive bumps 800 to another of the electrically conductive bumps 800 is performed after selectively etching the electrically conductive layer 500. As all of the electrically conductive pads 600 are no longer electrically connected together, specific vias 300 and/or electric pathways may be specifically tested.

The method 200 may also include (not shown) recording a result of the testing of the electrical connectivity and/or reporting the result to a user. For instance, the system 911 may include a computerized database 913 in communication with the current sensor 910 to store the results of the testing. A display 914 in communication with the database 916 may be utilized to report the results of the testing. Alternatively, testing results may be sent to a controller (not shown) controlling production of interposer 100. Thus, a poor quality interposer 100 may be automatically rejected, i.e., discarded, without human intervention.

The method 200 may also include (not shown) removing the carrier 912 from the wafer 102. The method 200 may further include (not shown) further etching of the electrically conductive layer 500, such that each electrically conductive pad 600 is electrically isolated from one another.

The present embodiments have been described herein in an illustrative manner, and it is to be understood that the terminology which has been used is intended to be in the nature of words of description rather than of limitation. Obviously, many modifications and variations are possible in light of the above teachings. Other embodiments may be practiced otherwise than as specifically described within the scope of the appended claims.

What is claimed is:

1. A method of forming and testing an interposer, comprising:
   forming vias in a semiconductor material of a wafer having a front side and a back side;
   disposing an electrically conductive layer on the front side of the wafer such that the electrically conductive layer is electrically connected to the vias;
   forming electrically conductive pads on the front side of the wafer wherein each electrically conductive pad is electrically connected to the electrically conductive layer and wherein the electrically conductive layer is sandwiched between at least one of the conductive pads and at least one of the vias;
   forming electrically conductive bumps on the back side of the wafer wherein each electrically conductive bump is electrically connected to at least one via; and
   testing electrical connectivity from a first bump of the electrically conductive bumps to a second bump of the electrically conductive bumps after said disposing of the electrically conductive layer.

2. The method as set forth in claim 1, further comprising selectively etching the electrically conductive layer such that a first plurality of electrically conductive pads are electrically connected together and electrically isolated from a second plurality of electrically conductive pads.

3. The method as set forth in claim 2, wherein testing electrical connectivity from the first bump to the second bump is performed after said selectively etching the layer.

4. The method as set forth in claim 1, further comprising reporting a result of said testing electrical connectivity to a user.

5. The method as set forth in claim 1, further comprising removing a portion of the back side of the wafer to expose the vias after said disposing an electrically conductive layer and prior to said forming electrically conductive bumps.

6. The method as set forth in claim 1, wherein said testing electrically connectivity comprises:
   electrically connecting a first probe to the first bump;
   electrically connecting a second probe to the second bump;
   applying an electric current to the first probe; and
   sensing the electric current received by the second probe.

7. The method as set forth in claim 1, further comprising bonding the front side of the wafer to a carrier.

8. The method as set forth in claim 7, wherein said testing electrical connectivity from a first bump of the electrically conductive bumps to a second bump of the electrically conductive bumps occurs after said bonding of the front side of the wafer to the carrier.

9. An interposer for an integrated circuit, comprising:
   a wafer comprising a semiconductor material and defining a front side and a back side;
   vias disposed within said semiconductor material;
   an electrically conductive layer disposed on said front side and electrically connected to said vias;
   electrically conductive pads disposed on said front side of said wafer and electrically connected to said electrically conductive layer wherein said electrically conductive layer is sandwiched between at least one of said conductive pads and at least one of said vias; and
   electrically conductive bumps disposed on said back side of said wafer wherein each electrically conductive bump is electrically connected to at least one of said vias.

10. The interposer as set forth in claim 9 wherein said front side is bonded to a carrier.

11. The interposer as set forth in claim 10 wherein said electrically conductive layer is selectively etched such that a first plurality of said electrically conductive pads is electrically connected together and a second plurality of said electrically conductive pads is electrically connected together.

12. The interposer as set forth in claim 11 wherein said first plurality and said second plurality of said electrically conductive pads are electrically isolated from one another.

13. The interposer as set forth in claim 9 wherein said electrically conductive layer is selectively etched such that a first plurality of said electrically conductive pads is electrically connected together and a second plurality of said electrically conductive pads is electrically connected together.

14. The interposer as set forth in claim 13 wherein said first plurality and said second plurality of said electrically conductive pads are electrically isolated from one another.

\* \* \* \* \*